US012681093B2

(12) United States Patent
Hasegawa

(10) Patent No.: US 12,681,093 B2
(45) Date of Patent: Jul. 14, 2026

(54) ELECTRONIC APPARATUS, CONTROL METHOD THEREOF, AND STORAGE MEDIUM

(71) Applicant: CANON KABUSHIKI KAISHA, Tokyo (JP)

(72) Inventor: Takashi Hasegawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 167 days.

(21) Appl. No.: 18/678,154

(22) Filed: May 30, 2024

(65) Prior Publication Data

US 2024/0410950 A1 Dec. 12, 2024

(30) Foreign Application Priority Data

Jun. 12, 2023 (JP) .................................. 2023-096469

(51) Int. Cl.
G01R 31/371 (2019.01)
G01R 31/387 (2019.01)

(52) U.S. Cl.
CPC ......... G01R 31/371 (2019.01); G01R 31/387 (2019.01)

(58) Field of Classification Search
CPC ....... G01R 31/387; G01R 31/371; H02J 7/82; H01M 2220/30; H01M 10/48
USPC ........................................................ 324/426
See application file for complete search history.

(56) References Cited

U.S. PATENT DOCUMENTS

2002/0169572 A1* 11/2002 Suzuki ............. G01R 19/16542
702/99
2006/0164042 A1* 7/2006 Sim ...................... G01R 31/374
320/150

2013/0073236 A1* 3/2013 Wu ..................... G01R 31/3842
702/63
2016/0084916 A1* 3/2016 Kim ........................ B60L 58/12
324/426
2019/0033395 A1* 1/2019 Karner ................. G01R 31/392
2022/0013817 A1* 1/2022 Yan ......................... A24F 40/53
2023/0204670 A1* 6/2023 Zhao .................... G01R 31/382
702/63

FOREIGN PATENT DOCUMENTS

JP 2000209649 A 7/2000
JP 2007227150 A 9/2007
JP 2015155859 A 8/2015

OTHER PUBLICATIONS

Translation of JP 2000209649 (Year: 2000).*
European Search Report issued on Nov. 14, 2024, which is enclosed, that issued in the corresponding European Patent Application No. 24180127.3.

* cited by examiner

*Primary Examiner* — Christopher P Mcandrew

(74) *Attorney, Agent, or Firm* — Cowan, Liebowitz & Latman, P.C.

(57) ABSTRACT

An electronic apparatus communicates with a battery and obtains, from the battery, information related to a remaining capacity of the battery. The apparatus identifies a communication standard for obtaining the information related to the remaining capacity of the battery, and outputs a remaining level of the battery obtained based on the information related to the remaining capacity of the battery. The apparatus obtains the remaining level of the battery by adjusting the remaining capacity of the battery in accordance with the communication standard being identified.

14 Claims, 4 Drawing Sheets

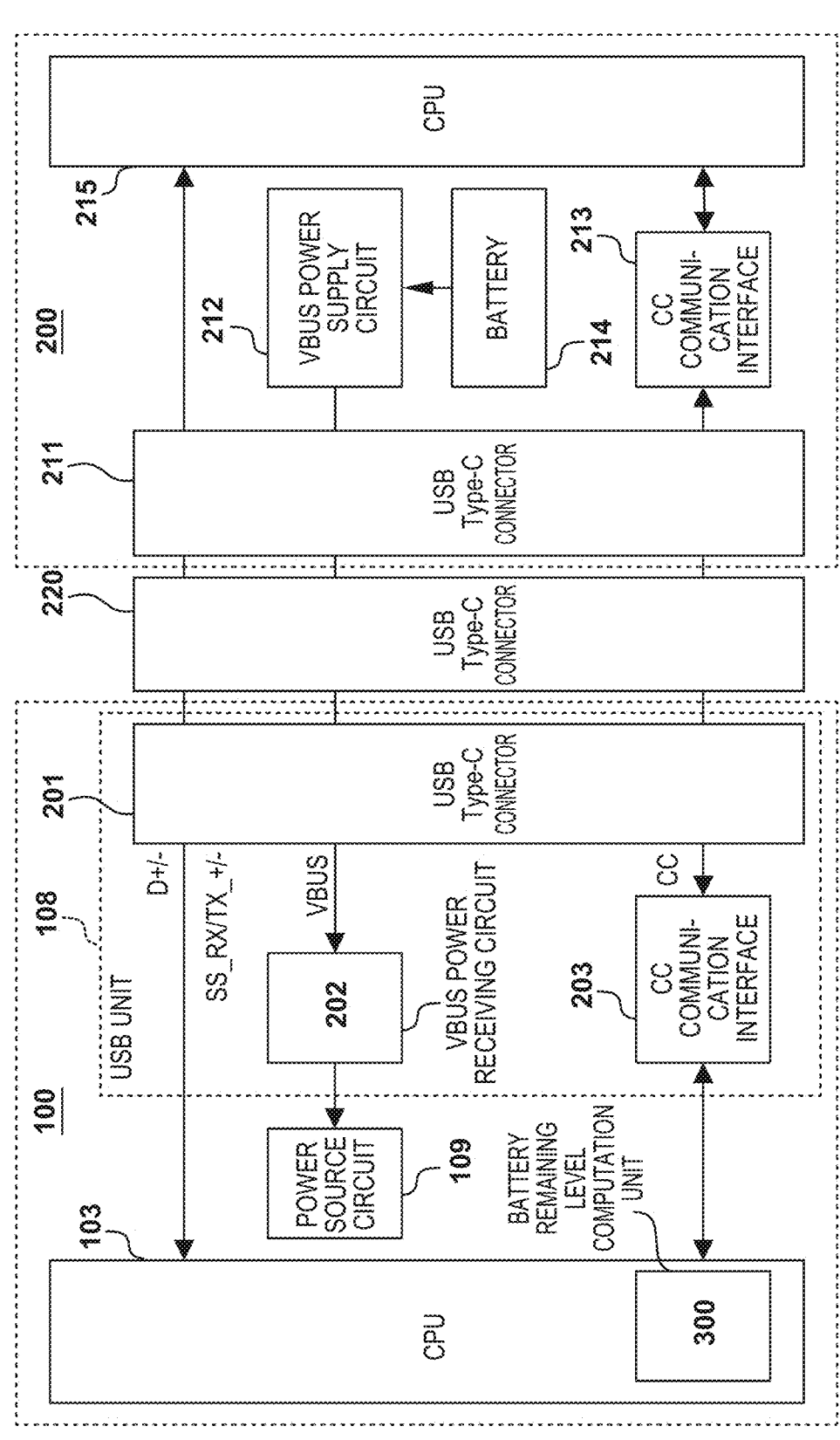
F I G. 2

ELECTRONIC APPARATUS, CONTROL METHOD THEREOF, AND STORAGE MEDIUM

BACKGROUND OF THE INVENTION

Field of the Invention

The present invention relates to an electronic apparatus, a control method thereof, and a storage medium.

Description of the Related Art

The Universal Serial Bus (USB) Type-C standard is known as a standard related to connectors of electronic apparatuses. In addition, the USB Power Delivery (PD) standard is known as a standard for supplying and receiving DC power between apparatuses using a connector and a cable compliant with the USB Type-C standard. Two electronic apparatuses compliant with the USB PD standard can exchange, for example, information related to the battery remaining capacity and the like. For example, in a case where one of the electronic apparatuses (digital camera) receives power supply from the other electronic apparatus (a battery such as a mobile battery) via a USB Type-C connector, the time period, in which the electronic apparatus is operational by the power supply, or the remaining level of the battery can be displayed.

Technology that uses a polarization voltage curve associating electric current with temperature in a battery in order to accurately obtain the remaining level of the battery to be displayed is known (see Japanese Patent Laid-Open No. 2015-155859). In addition, technology that allows for quickly obtaining information from a battery that can perform high-speed communication, based on voltage of a predetermined terminal, when displaying the remaining level of the battery on an electronic apparatus (see Japanese Patent Laid-Open No. 2007-227150).

Now, the accuracy or reliability of the obtained remaining capacity of the battery may differ in a case where a plurality of revisions of the communication standard are specified for obtaining the remaining capacity of the battery, or a case where a plurality of communication standards exist. Accordingly, there is a problem that the accuracy of the remaining level to be displayed may not be maintained in a case where the remaining level of the battery is displayed using the obtained remaining capacity of the battery.

SUMMARY OF THE INVENTION

The present invention has been made in view of the aforementioned problem, and the object of the present invention is to realize the technology that allows for outputting the remaining level with a high accuracy in a case where an external battery is connected to use.

In order to solve the aforementioned issues, one aspect of the present disclosure provides an electronic apparatus comprising: a communication unit configured to communicate with a battery; an obtaining unit configured to obtain, from the battery, information related to a remaining capacity of the battery via the communication unit; an identification unit configured to identify a communication standard for obtaining the information related to the remaining capacity of the battery; and an output unit configured to output a remaining level of the battery obtained based on the information related to the remaining capacity of the battery, wherein the output unit obtains the remaining level of the battery by adjusting the remaining capacity of the battery in accordance with the communication standard being identified.

Another aspect of the present disclosure provides a method of controlling an electronic apparatus that includes a communication unit configured to communicate with a battery, the method comprising: obtaining, from the battery, information related to a remaining capacity of the battery via the communication unit; identifying a communication standard for obtaining the information related to the remaining capacity of the battery; and outputting a remaining level of the battery obtained based on the information related to the remaining capacity of the battery, wherein, in the outputting, the remaining level of the battery is obtained by adjusting the remaining capacity of the battery in accordance with the communication standard being identified.

Still another aspect of the present disclosure provides a non-transitory computer-readable storage medium comprising instructions for performing a method of controlling an electronic apparatus that includes a communication unit configured to communicate with a battery, the method comprising: obtaining, from the battery, information related to a remaining capacity of the battery via the communication unit; identifying a communication standard for obtaining the information related to the remaining capacity of the battery; and outputting a remaining level of the battery obtained based on the information related to the remaining capacity of the battery, wherein, in the outputting, the remaining level of the battery is obtained by adjusting the remaining capacity of the battery in accordance with the communication standard being identified.

According to the present invention, it becomes possible to output the remaining level with a high accuracy in a case where an external battery is connected to use.

Further features of the present invention will become apparent from the following description of exemplary embodiments (with reference to the attached drawings).

BRIEF DESCRIPTION OF THE DRAWINGS

FIG. 2 is a block diagram illustrating a configuration example of a USB external apparatus 200 as an example of a battery, and a configuration example related to supplying and receiving power of an image capturing apparatus 100, according to an embodiment;

DESCRIPTION OF THE EMBODIMENTS

Figure 1:
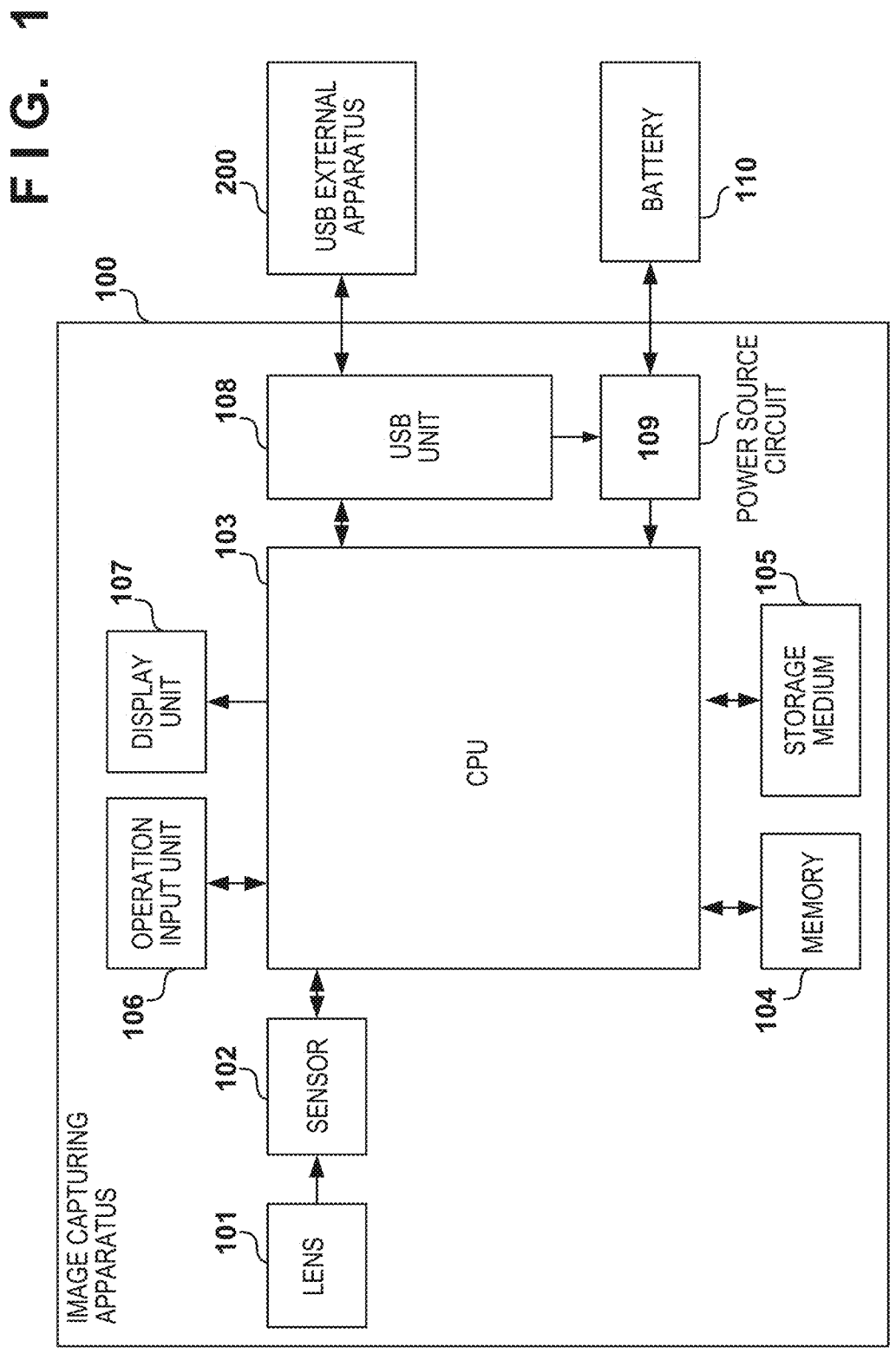
FIG. 1 is a block diagram illustrating a configuration example of an image capturing apparatus as an example of an electronic apparatus, according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

An example of using an image capturing apparatus that can receive supply of power from an external apparatus will be described in the following as an example of the electronic apparatus. Such an image capturing apparatus may include, for example, a digital camera, a digital video camera, a personal computer, a tablet terminal, a smartphone, an industrial camera, and a medical camera. In addition, the present embodiment can be applied not only to the image capturing apparatus but also to other electronic apparatuses that can receive supply of power from an external apparatus. Such an electronic apparatus may include, for example, a game machine, a wearable terminal, or the like.

(Configuration of Image Capturing Apparatus)

A configuration example of an image capturing apparatus 100 will be described, referring to FIG. 1. A lens 101 forms an optical image of a subject on an image capturing surface of a sensor 102. The sensor 102, which includes an image capturing element for example, generates image data from the optical image formed on the image capturing surface.

A CPU 103 processes the image data generated by the sensor 102 by performing a predetermined image processing and a predetermined encoding processing. The image data processed by the CPU 103 is recorded in a storage medium 105 and displayed on a display unit 107. Furthermore, the CPU 103 controls respective components of the image capturing apparatus 100 via connection (e.g., bus) that is not illustrated by executing programs stored in a memory 104. In addition, by executing the programs, the CPU 103 can realize functions of each unit of the battery remaining level computation unit 300 which will be described later.

The memory 104, which includes a semiconductor memory for example, can store programs for controlling each component of the image capturing apparatus 100. The memory 104 can also store various information and data used by the CPU 103. The information includes, for example, information of consumed current or consumed power in the image capturing apparatus 100, information of a reference table for a communication standard identification unit 302 described later to identify and determine the communication standard, or the like. In addition, the memory 104 can store image data or the like for notifying the user of the state of the image capturing apparatus 100. The storage medium 105 is a storage medium, which includes a memory card for example, stores image data encoded by the CPU 103.

An operation input unit 106 includes a button and a user interface for the user to operate the image capturing apparatus 100. The display unit 107 includes a display such as, for example, a display panel. The display unit 107 performs display for checking an image to be captured or display for checking reproduction of a captured image, and also performs display indicating an operation mode of the image capturing apparatus 100 or the remaining level of the battery.

A USB unit 108 connects to a USB external apparatus 200, in compliance with the USB standard, the USB Type-C standard, the USB Power Delivery (USB PD) standard, or the like.

The USB Type-C standard is a standard related to a connector of an electronic apparatus. A connector compliant with the USB Type-C standard can be used not only for data communication between two electronic apparatuses but also for power supply between the two electronic apparatuses. The USB PD standard is a standard for supplying and receiving DC power between apparatuses using a connector and a cable compliant with the USB Type-C standard. The two electronic apparatuses compliant with the USB PD standard include connectors compliant with the USB Type-C standard. The USB Type-C connector includes a configuration channel (CC) terminal. In the USB PD standard, communication in a CC terminal (referred to as CC communication in the following) related to detection of connection of an external power supply apparatus, arbitration related to supplying and receiving power, and exchange of information related to a battery remaining capacity, or the like are specified.

A power source circuit 109 includes a power source circuit that converts the voltage supplied from a battery 110 or the USB unit 108 to a voltage used by each component (the lens 101, the sensor 102, the CPU 103, or the like) of the image capturing apparatus 100. The battery 110, which includes a dedicated battery, such as a lithium-ion battery, connected to the image capturing apparatus 100 for example, supplies power for the image capturing apparatus 100 to operate. The USB external apparatus 200 will be described later.

Next, referring to FIG. 2, an example of a configuration of the USB external apparatus 200 and a configuration related to supplying and receiving power of the image capturing apparatus 100 will be described. The image capturing apparatus 100 is connected to the USB external apparatus 200 via a USB Type-C cable 220. The USB external apparatus 200 may be, for example, a personal computer, an AC adapter, a mobile battery, or the like, that can supply power to the image capturing apparatus 100.

The USB unit 108 includes a USB Type-C connector 201, a VBUS power receiving circuit 202, and a CC communication interface 203. The USB Type-C connector 201 (and a USB Type-C connector 211 described later) is a USB Type-C connector connected to the USB Type-C cable 220. The USB Type-C connector includes D+/D− terminals and SS+/SS− terminals for data communication lines, a GND terminal for the ground signal (not illustrated), a VBUS terminal for a power supply line, and a Configuration Channel (CC) terminal. The CC terminal is a terminal compliant with the USB Type-C standard and the USB PD standard. The CC terminal is used for communicating power supply negotiation compliant with the USB PD standard, and power source information of the USB external apparatus 200, particularly for a case of a mobile battery or the like, information related to the remaining capacity of the battery. The VBUS power receiving circuit 202 is a circuit including a DC-DC converter or the like that converts VBUS voltage supplied from the USB external apparatus 200, to voltage of a system power source of the image capturing apparatus 100. The VBUS power receiving circuit 202 operates as a power source of the image capturing apparatus 100 via the power source circuit 109. A CC communication interface 203 is connected to a CC communication interface 213 of the USB external apparatus 200 via the CC terminal of the USB Type-C connector 201. The CC communication interface 203 includes a so-called dedicated IC for CC communication.

The USB external apparatus 200 is, for example, a so-called mobile battery including a USB terminal and a battery. The USB external apparatus 200 includes a USB Type-C connector 211, a VBUS power supply circuit 212, a CC communication interface 213, a battery 214, and a CPU 215.

The VBUS power supply circuit 212 is a circuit including a DC-DC converter or the like that generates VBUS voltage from the electromotive force of the battery 214 of the USB external apparatus 200. The battery 214, which includes a built-in lithium-ion battery or the like, supplies power for the USB external apparatus 200 to operate. The USB Type-C connector 211 and the CC communication interface 213 are respectively equivalent to the USB Type-C connector 201 and the CC communication interface 203 described above.
(Configuration of Battery Remaining Level Computation Unit)

Figure 3:
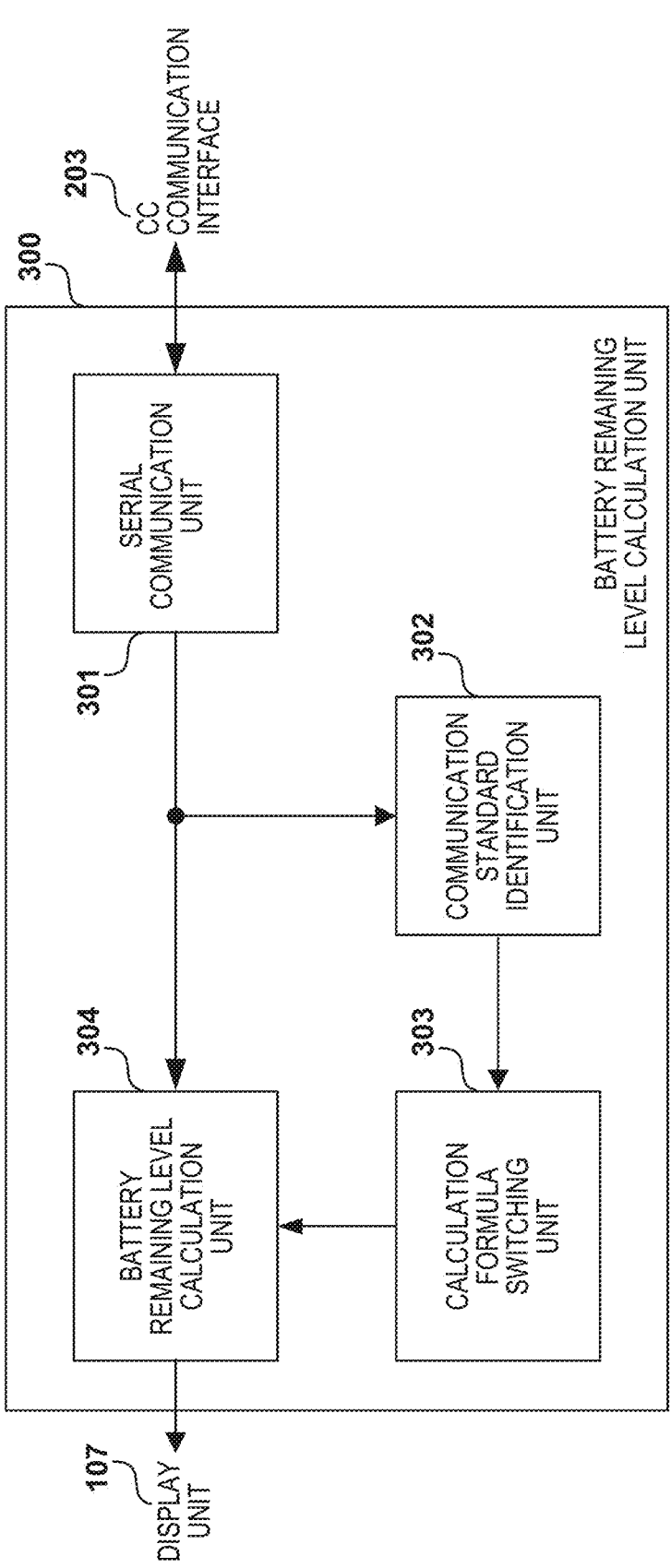
FIG. 3 is a block diagram illustrating a functional configuration of a battery remaining level computation unit 300, according to an embodiment.

Next, a configuration example of the battery remaining level computation unit 300 in the CPU 103 will be described, referring to FIG. 3. As has been described above, in the present embodiment, connection with the USB external apparatus 200 is in compliance with the USB Type-C standard and the USB PD standard.

In displaying the remaining level of the battery of the USB external apparatus 200, the accuracy and reliability of the remaining capacity of the battery that can be obtained at the image capturing apparatus 100 side may differ, depending on a revision of the communication standard such as the USB PD standard. Therefore, calculating the battery remaining level in the image capturing apparatus 100 by using the same calculation formula may fail to maintain the accuracy of the battery remaining level. In other words, there is a possibility that the accuracy of the remaining level display cannot be improved in displaying the battery remaining level on the display unit 107, or that operation is unexpectedly changed to power saving operation (e.g. although display is indicating sufficient battery remaining level, power shortage suddenly happen).

Here for example, a case where the image capturing apparatus 100 obtains the remaining capacity of the USB external apparatus 200 via CC communication and performs calculation of the battery remaining level will be described as an example. A plurality of revisions is standardized for the USB PD standard at the present time, and further updating and addition of functions is expected in the future. In other words, the accuracy and reliability related to the remaining capacity of the battery may vary as the revision of the USB PD standard is further updated. For example, as the revisions of the standard are different, there are some cases in which handling related to the battery remaining capacity in the standard to be Optional or Mandatory is different. In other cases, specification related to the accuracy or the updating cycle may be different. In other words, when a plurality of communication standards is used, if the battery remaining level is calculated by using a same computation method for all of the remaining capacity being obtained, a problem may occur that the accuracy of the remaining level display cannot be maintained, as has been described above. In the present embodiment, therefore, the processing by the battery remaining level computation unit 300 adjusts the remaining capacity of the battery in accordance with the communication standard, and calculates (or obtains) a more appropriate remaining level of battery.

In the following description of the present embodiment, a case where each functional unit of the battery remaining level computation unit 300 is realized by the CPU 103 will be described as an example. However, the battery remaining level computation unit 300 may be configured by a hardware independent of the CPU 103, or may be implemented by executing a program by a hardware independent of the CPU 103.

The battery remaining level computation unit 300 includes a serial communication unit 301, a communication standard identification unit 302, a calculation formula switching unit 303, and a battery remaining level calculation unit 304. The serial communication unit 301, which can control serial communications such as I2C, for example, performs communication with the CC communication interface 203. For example, the serial communication unit 301 can obtain information related to the remaining capacity of the battery 214 of the USB external apparatus 200 via the CC communication interface 203. The information related to the remaining capacity of the battery 214 may include various information for estimating the remaining capacity of the battery 214, or may include only information of the remaining capacity of the battery 214.

The communication standard identification unit 302 obtains and identifies a revision of the communication standard of the CC communication interface 203 (i.e., a communication standard for obtaining information related to the remaining capacity) via the serial communication unit 301. In addition, the communication standard identification unit 302 can determine the reliability of the battery remaining level in the revision of the communication standard, in accordance with the revision of the communication standard. Specifically, a method of storing, in the memory 104, a reliability evaluation table of a communication standard, in which revisions of the communication standard are associated with numerical values representing the reliability, and referring to the reliability evaluation table may be used. Here, a case of obtaining and identifying a revision of the communication standard is described in the present embodiment as an example, it is also applicable to a case where different communication standards exist, without being limited to the case where different revisions exist in the communication standard. In the present disclosure, a case of simply describing "identify a communication standard" may include a case of identifying different communication standards, and a case of identifying different versions or revisions of the communication standard. Here, in a case where there exist different communication standards, it is possible to refer to a table in which communication standards are associated with numerical values indicating reliability, in place of, or in addition to, the table in which revisions are associated with numerical values indicating reliability.

The calculation formula switching unit 303 switches calculation formulas of the battery remaining level in the battery remaining level calculation unit 304 described later, in accordance with the result of determination by the communication standard identification unit 302. The battery remaining level calculation unit 304 calculates a battery remaining time from the remaining capacity of the battery obtained from the serial communication unit 301 and the calculation formula set by the calculation formula switching unit 303. The battery remaining time calculated by the battery remaining level calculation unit 304 is displayed in the display unit 107 via a bus (not illustrated).

In the battery remaining level calculation processing executed by the battery remaining level computation unit 300, a time period, during which the image capturing apparatus 100 is operational by using a power source such as the battery 110 or the battery 214 of the USB external apparatus 200, is computed, and the calculation result is output (displayed in the display unit 107) as the remaining level of the battery. Here, the battery remaining level calculation processing in a case where the power is supplied from the USB external apparatus 200 will be described. The battery remaining level computation unit 300 can obtain the battery remaining time T [min] according to the following formula 1. The following formula use a remaining capacity C [mAh] obtained from the battery, a consumed current I [mA] of the image capturing apparatus 100, a margin capacity M [mAh], and a correction coefficient K.

$$T = (C - M) \times K / I \times 60 \qquad \text{(Formula 1)}$$

(Series of Operations Related to Battery Remaining Level Calculation Processing in Image Capturing Apparatus 100)

Figure 4:
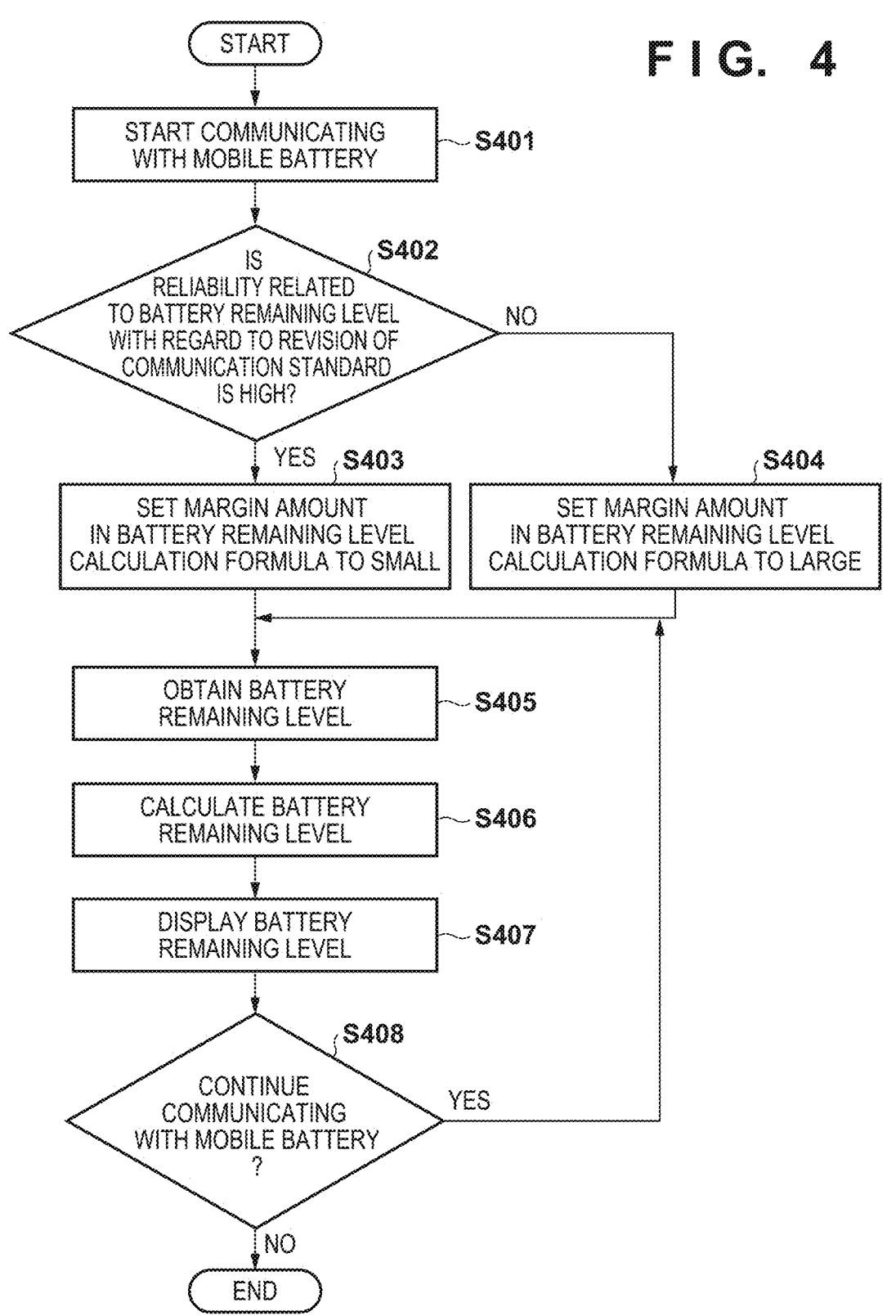
FIG. 4 is a flowchart illustrating a sequence of operations of a battery remaining level computation processing of the image capturing apparatus according to an embodiment.

A series of operations of the battery remaining level calculation processing in the image capturing apparatus 100, will be described, referring to FIG. 4. The battery remaining level calculation processing is realized, for example, by the CPU 103 executing a program stored in the memory 104. Here, the processing starts in a case where the CPU 103 is connected to the external apparatus 200 and the system is activated.

At S401, the serial communication unit 301 of the CPU 103 starts communication with the external apparatus via the CC communication interface.

At S402, the communication standard identification unit 302 of the CPU 103 determines the reliability related to the battery remaining level, for the revision of the communication standard of the communication started at S401. In a case where the reliability related to the battery remaining level with regard to the revision of the communication standard is determined, by the communication standard identification unit 302, to be higher than a predetermined value, the processing advances to S403, or in a case where it is determined to be not higher than the predetermined value, the processing advances to S404. For the determination of the reliability related to the battery remaining level with regard to the revision of the communication standard, it is possible to refer to, for example, the reliability evaluation table of the communication standard stored in the memory 104. For example, the reliability evaluation table is configured such that the revisions of the communication standard are associated with the reliability.

The reliability evaluation table may be configured such that, for example, the lower reliability is associated with the revision of the communication standard as the revision is earlier. Alternatively, the reliability evaluation table may be configured such that an earlier revision than a specific revision is associated with a first reliability that is low, and a revision equal to or later than the specific revision is associated with a reliability higher than the first reliability.

At S403, the calculation formula switching unit 303 of the CPU 103 sets a margin amount (correction amount) in the remaining level calculation formula used by the battery remaining level calculation unit 304 and determines the remaining level calculation formula. Specifically, the calculation formula switching unit 303 sets a margin amount M in the calculation formula to a value referred to as a margin amount MS, which is smaller than a margin amount ML described later.

At S404, the calculation formula switching unit 303 sets a margin amount (correction amount) in the remaining level calculation formula used by the battery remaining level calculation unit 304 and determines the remaining level calculation formula. Specifically, the calculation formula switching unit 303 sets the margin amount M in the calculation formula to a value called a margin amount ML, which is larger than the aforementioned margin amount MS.

At S405, the battery remaining level calculation unit 304 of the CPU 103 obtains information related to the remaining capacity of the battery from the USB external apparatus 200 via the serial communication unit 301. At S406, the battery remaining level calculation unit 304 computes the battery remaining time (remaining level of battery) based on the remaining capacity of the battery obtained at S405 and the remaining level calculation formula set by the calculation formula switching unit 303. Accordingly, the remaining level of the battery can be computed, which is obtained by adjusting the remaining capacity C of the battery in the aforementioned formula 1 with the margin capacity M in accordance with (the reliability of) the revision of the communication standard.

In the foregoing description of the present embodiment, a case is described as an example in which the revision of the communication standard for obtaining information related to the remaining capacity of the battery is obtained and identified, subsequently the reliability of the battery remaining level is determined, and the margin is set (changing the calculation formula) in accordance with the reliability. However, the present embodiment can also be applied to a case in which the revision of the communication standard for obtaining information related to the remaining capacity of the battery is obtained and identified, subsequently the margin is set (changing the calculation formula) in accordance with the revision of the communication standard. In such a case, the communication standard identification unit 302 can set a margin associated with the revision of the communication standard being identified by referring to a table in which the revisions of the communication standard are associated with the margins.

For example, in a case where the communication standard being identified is a revision of the first communication standard, the first margin (correction amount) is applied to the remaining capacity of the battery. In a case where the revision of the communication standard being identified is earlier than the revision of the first communication standard, a margin larger than the first margin is applied to the remaining capacity of the battery. Accordingly, it is possible to adjust the remaining capacity of the battery by applying a larger margin to the earlier revision. In this case, the revision of the first communication standard may be a revision of the communication standard that specifies the transmission of information related to the remaining capacity of the battery to be mandatory. In addition, the earlier revision of the communication standard may be a revision of a communication standard that specifies the transmission of information related to the remaining capacity of the battery to be optional.

Alternatively, in a case where the revision of the communication standard being identified is earlier than the revision of the first communication standard, the remaining capacity of the battery may be adjusted such that the remaining capacity varies more largely than a case where the revision of the first communication standard is identified. In this case, the remaining capacity of the battery can be adjusted by applying a smaller margin to the revisions equal to or later than the specific revision.

Accordingly, the remaining level of the battery can also be computed, which is obtained by adjusting the remaining capacity C of battery in the aforementioned formula 1 with the margin M in accordance with the revision of the communication standard.

According to the description of the present embodiment, the remaining capacity of the battery is adjusted in accordance with the result of determination at S402 by setting margin amounts of different sizes, in any case of the determination result. In the present embodiment, however, the margin may be set to adjust the remaining level only in a case where a communication standard of low reliability is used. For example, in a case where the communication standard being identified is a communication standard earlier than the specific communication standard, a margin is set to adjust the remaining capacity of the battery. On the other hand, in a case where the communication standard being identified is equal to or later than the specific communication standard, a margin may not be set in order not to adjust the remaining capacity of the battery.

In the foregoing description, a case of setting different values to the margin in formula 1 is described as an example. However, either one of formula 1 or another formula having different arithmetic operation from formula 1 may be used, in accordance with the result of determination at S402. In a case where, for example, the revision of the communication standard being identified is a second revision earlier than the specific revision, a calculation formula may be used in which the remaining capacity of the battery varies more largely than a case where the specific revision is identified.

When, at S407, the remaining level of the battery computed by the battery remaining level calculation unit 304 is output, the CPU 103 causes the display unit 107 to display the remaining level of the battery. At S408, the CPU 103 determines whether or not to continue the communication. For example, the CPU 103 terminates communication with the USB external apparatus 200 and ends the processing, in a case where an instruction to turn off the power source of the image capturing apparatus 100, or in a case where removal of a cable is detected. On the other hand, the CPU 103 advances the processing to S405, in a case where it is determined to continue the communication.

As such, in the present embodiment, the CPU 103 is configured to set different margins to the calculation formula of the battery remaining level, in accordance with (the reliability or the revision of) the communication standard with the external apparatus being connected. Therefore, in a case where the reliability of the remaining capacity of the battery of the communication standard being identified is expected to be high, the accuracy of the remaining level calculation may be improved without setting excessive margin. In a case where, on the other hand, the reliability of the battery remaining capacity of the communication standard being identified is expected to be low, the remaining level calculation securing a larger margin can be performed. In such a case, the remaining level of the battery displayed on the display unit 107 is relatively smaller than a case of high reliability. In other words, the CPU 103 can give a higher priority to avoiding power source shutdown that does not match the remaining level display of the battery (e.g. although the battery remaining level looks to be sufficient, the battery runs out). In the present embodiment, as has been described above, an accurate remaining level can be output in a case of connecting an external battery for continuous use.

In the foregoing description of an embodiment, a case of computing the remaining level of the battery using the remaining capacity of the battery and the margin or the like is described as an example. However, the present embodiment includes obtaining the remaining level of the battery by referring to a table in which the remaining capacity of the battery is associated with the margin, or a table in which the remaining capacity of the battery is associated with the communication standard. Alternatively, instead of calculating the remaining level of the battery, the remaining level of the battery may be obtained from an external apparatus for example, by transmitting the remaining capacity of the battery and the communication standard to the external apparatus.

In addition, identification of the revision of the communication standard performed by the communication standard identification unit 302 at S402 can be performed by various methods. For example, the communication standard identification unit 302 may obtain information for identifying the communication standard from the USB external apparatus 200 via the serial communication unit 301. For example, the communication standard identification unit 302 may obtain, to determine, a unique bit indicating the revision of the communication standard from the serial communication unit 301. Alternatively, the communication standard identification unit 302 may identify the revision of the communication standard from the format of storing the information related to the battery remaining level or a corresponding command received by the serial communication unit 301. In addition, the communication standard identification unit 302 may determine the reliability based on the release time of the revision of the communication standard.

Furthermore, the CPU 103 may make it selectable whether or not to perform the control from S402 to S404 (i.e., whether or not to change the remaining level calculation formula), in accordance with the operation input from the operation input unit 106.

In addition, the CPU 103 may control such that the change of the remaining level calculation formula is executed only for the calculation of the battery remaining level of the USB external apparatus 200, and the remaining level calculation formula for the calculation of the battery remaining level of the battery 110 is not changed. For example, although the image capturing apparatus 100 can obtain information related to the remaining capacity of a dedicated battery, via connection of the dedicated battery that is exclusively used, the remaining capacity of the dedicated battery need not be adjusted unlike the remaining capacity of the USB external apparatus 200.

Other Embodiments

Various functions, processing, or methods described in the aforementioned embodiments can be realized by a personal computer, a microcomputer, a Central Processing Unit (CPU) or the like using programs. In an embodiment, a personal computer, a microcomputer, a CPU or the like is referred to as a "computer X". Additionally, in an embodiment, a program for controlling the computer X, which realizes the various functions, processing, or methods described in the aforementioned embodiment, is referred to as a "program Y". The various functions, processing, or methods described in the aforementioned embodiments are realized by the computer X executing the program Y. In this case, the program Y is supplied to the computer X via a computer-readable storage medium. The computer-readable storage medium in an embodiment includes at least one of a hard disk apparatus, a magnetic storage apparatus, an optical storage apparatus, a magneto-optical storage apparatus, a memory card, a volatile memory, a non-volatile memory, or the like. The computer-readable storage medium in an embodiment is a non-transitory storage medium.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-096469, filed Jun. 12, 2023 which is hereby incorporated by reference herein in its entirety.

What is claimed is:

1. An electronic apparatus comprising:

a CPU which functions as:

a communication unit configured to communicate with a battery;

an obtaining unit configured to obtain, from the battery, information related to a remaining capacity of the battery via the communication unit;

an identification unit configured to identify a communication standard for obtaining the information related to the remaining capacity of the battery; and an output unit configured to output a remaining level of the battery obtained based on the information related to the remaining capacity of the battery, wherein the output unit obtains the remaining level of the battery by adjusting the remaining capacity of the battery in accordance with the communication standard being identified, wherein the electronic apparatus can obtain information related to a remaining capacity of a dedicated battery exclusively used for the electronic apparatus, via a connection unit configured to connect the dedicated battery, wherein the output unit adjusts the remaining capacity of the battery in accordance with the communication standard being identified, but does not adjust the remaining capacity of the dedicated battery.

2. The electronic apparatus of claim 1, wherein the output unit adjusts the remaining capacity of the battery by applying a correction amount, in accordance with the communication standard being identified, to the remaining capacity of the battery.

3. The electronic apparatus of claim 2, wherein the output unit applies a first correction amount to the remaining capacity of the battery, in a case where the communication standard being identified is a first communication standard, and the output unit applies a second correction amount that is larger than the first correction amount to the remaining capacity of the battery, in a case where the communication standard being identified is a second communication standard earlier than the first communication standard.

4. The electronic apparatus of claim 1, wherein the output unit adjusts the remaining capacity of the battery in a case where the communication standard being identified is a second communication standard earlier than a first communication standard, such that the remaining capacity of the battery varies more largely than a case where the first communication standard is identified.

5. The electronic apparatus of claim 1, wherein the output unit adjusts the remaining capacity of the battery, in a case where the communication standard being identified is a second communication standard earlier than a first communication standard, by using a calculation formula that causes the remaining capacity of the battery to vary more largely than a case where the first communication standard is identified.

6. The electronic apparatus of claim 1, wherein the output unit adjusts the remaining capacity of the battery in a case where the communication standard being identified is a second communication standard earlier than a first communication standard, or does not adjust the remaining capacity of the battery in a case where the communication standard being identified is a communication standard equal to or later than the first communication standard.

7. The electronic apparatus of claim 1, wherein the identification unit obtains information for identifying the communication standard from the battery via the communication unit.

8. The electronic apparatus of claim 1, wherein the identification unit identifies the communication standard, based on a format of storing the information related to the remaining capacity of the battery.

9. The electronic apparatus of claim 3, wherein the first communication standard is a communication standard that specifies the transmission of information related to the remaining capacity of the battery to be mandatory, and the second communication standard is a communication standard that specifies the transmission of information related to the remaining capacity of the battery to be optional.

10. The electronic apparatus of claim 1, wherein the identifying of the communication standard by the identifying unit includes identifying a version or a revision of the communication standard.

11. The electronic apparatus of claim 2, wherein the information related to the remaining capacity of the battery corresponds to the remaining capacity of the battery, and the correction amount is a correction amount for the remaining capacity of the battery.

12. The electronic apparatus of claim 1, wherein the communication unit performs CC communication based on a USB Type-C standard.

13. A method of controlling an electronic apparatus that includes a communication unit configured to communicate with a battery, the method comprising:

obtaining, from the battery, information related to a remaining capacity of the battery via the communication unit;

identifying a communication standard for obtaining the information related to the remaining capacity of the battery; and outputting a remaining level of the battery obtained based on the information related to the remaining capacity of the battery, wherein, in the outputting, the remaining level of the battery is obtained by adjusting the remaining capacity of the battery in accordance with the communication standard being identified, wherein the method further comprises obtaining information related to a remaining capacity of a dedicated battery exclusively used for the electronic apparatus, via a connection unit of the electronic apparatus configured to connect the dedicated battery, wherein, in the outputting, the remaining capacity of the battery is adjusted in accordance with the communication standard being identified, but the remaining capacity of the dedicated battery is not adjusted.

14. A non-transitory computer-readable storage medium comprising instructions for performing a method of controlling an electronic apparatus that includes a communication unit configured to communicate with a battery, the method comprising:

obtaining, from the battery, information related to a remaining capacity of the battery via the communication unit;

identifying a communication standard for obtaining the information related to the remaining capacity of the battery; and outputting a remaining level of the battery obtained based on the information related to the remaining capacity of the battery, wherein, in the outputting, the remaining level of the battery is obtained by adjusting the remaining capacity of the battery in accordance with the communication standard being identified, wherein the method further comprises obtaining information related to a remaining capacity of a dedicated battery exclusively used for the electronic apparatus, via a connection unit of the electronic apparatus configured to connect the dedicated battery, wherein, in the outputting, the remaining capacity of the battery is adjusted in accordance with the communication standard being identified, but the remaining capacity of the dedicated battery is not adjusted.

\* \* \* \* \*